United States Patent [19]

Dugan

[11] Patent Number: 4,647,851
[45] Date of Patent: Mar. 3, 1987

[54] FINE LINE CIRCUITRY PROBES AND METHOD OF MANUFACTURE

[75] Inventor: William P. Dugan, Pomona, Calif.

[73] Assignee: General Dynamics, Pomona Division, Pomona, Calif.

[21] Appl. No.: 619,292

[22] Filed: Jun. 11, 1984

Related U.S. Application Data

[60] Division of Ser. No. 390,815, Jun. 21, 1982, which is a continuation of Ser. No. 125,814, Feb. 28, 1980, abandoned.

[51] Int. Cl.⁴ .................... G01R 31/02; G01R 1/06
[52] U.S. Cl. ........................... 324/158 P; 324/72.5; 324/158 F
[58] Field of Search .............. 324/158 P, 158 F, 72.5; 174/68.5; 339/17 R

[56] References Cited

U.S. PATENT DOCUMENTS 3,345,741 10/1967 Reimann .................... 174/68.5
3,742,597 7/1973 Davis ...................... 174/68.5

*Primary Examiner*—Ernest F. Karlsen
*Attorney, Agent, or Firm*—Henry M. Bissell; Edward B. Johnson

[57] ABSTRACT

Probes for testing circuitry comprising plural oriented, circular cross-section, microcircuit probes positioned in a dielectric base and having connections on the opposite side of base to attach probe circuitry. A method of manufacture of such probes includes assembling a laminate of a dielectric base, and an aluminum mandrel, drilling holes in the laminate at positions corresponding to the eventual probe positions, electroless plating the entire package, passivating the electroless plated coating, plating the entire assemblage until the holes are substantially filled with plating, separating and shearing off the layers of plating from the laminate, applying a photoresist and developing it on the aluminum side corresponding to the holes for the probes, and on the opposite side corresponding to the desired circuitry, removing the material on the aluminum side to expose the aluminum, dissolving the aluminum to expose the probes, and soldering and reflowing the solder on the probes.

6 Claims, 12 Drawing Figures

FINE LINE CIRCUITRY PROBES AND METHOD OF MANUFACTURE

This is a division of application Ser. No. 390,815, filed June 21, 1982, which is a continuation of Ser. No. 125,814, filed 2-28-80, now abandoned.

BACKGROUND OF THE INVENTION

1. Field of the Invention

The present invention relates to microcircuitry test equipment and, more particularly, to probes used therein.

2. Description of the Prior Art

There are numerous processes for the production of microcircuit test probes found in the prior art. For instance, probes have been designed which are disposed over a recess, and the testing circuit is then brought into contact by bending the probes into the recess. Additionally, probes have been produced by bending metallic elements; for example, see U.S. Pat. No. 3,702,439 to McGahey et al. Also, a flexible coating over a probe head has been suggested in Ardezzone U.S. Pat. No. 3,832,632. Further, probes have been embedded in flexible structures by processes such as those suggested in U.S. Pat. Nos. 3,835,381 to Garretson et al and 3,810,016 to Chayka et al.

In the disclosed methods and structures, at least some bending, either during manufacture or during operation, is performed on the probe or a related metallic structure. This, of course, leads to wear fatigue and breakage, especially when dealing with microcircuits where the element to be bent is very fine. In addition, all of these probes, since they are bent, are relatively flat in character, and thus are relatively weak.

Another method for the production of microcircuit probes has been disclosed by Best et al in IBM Technical Disclosure Bulletin, Vol. 15, No. 11 (April 1973). This process includes welding of an aligned probe to a preformed base which has, integral in it, a flexible area. The mandrel for the base is then removed to produce a flexible testing unit. This process requires microwelding or brazing, and thus could be improved upon by processes which would directly form the probes in the proper angular relationship to the remainder of the unit. In particular, it would be desirable to be able to reproduce the probe section of a tester for microcircuits without great difficulty, and to produce one that has relatively rigid probes which are manufactured independent of each other, are not easily bendable toward or away from each other, and do not break easily. To this end, the present invention has been directed.

SUMMARY OF THE INVENTION

The present improved method of manufacture produces new and improved fine line probes for connection to very fine circuits. In the process, a clad laminate, e.g. an epoxy board clad with copper, is attached to an aluminum or other dissolvable mandrel. Holes are then drilled in the laminated package at points where the probes are to be located. The diameter of the holes approximates the desired final size of the probes, and the thickness of the aluminum mandrel defines the length of the probes. Thus, these two components are preselected in accordance with the exact probe design desired.

The entire package is then, for example, electroless copper plated to provide conductivity over the whole of the surface, including the holes. Other conductive metal deposition may be utilized, so long as the resulting coating provides for continuity over the whole of the surface. The copper cladding is then passivated, for example, by chromic acid, or by a flash coating of nickel. The thus passivated, clad package is then plated, e.g. utilizing a copper electroplating bath until such time as the holes are almost completely closed. The resulting thick tube of, for example, copper formed in the holes will eventually form the probe structure of the present invention. It should be noted, at this point, that the time required for electroplating, the copper sulfate concentration, and the amperage utilized would be determinative of the copper deposition. These parameters would be selected in order to provide the appropriate thick tube. Additionally, if appropriate, the surface of the eventual board opposite the side of the probe is provided with small holes for attachment, e.g. by soldering, of leads. In the alternative, the circuit board structure may be utilized to separate the leads to appropriate positions. Finally, in view of the subsequent steps, the thickness of the electrodeposited copper coating does not control the fineness of the circuit resulting from the process of the present invention. Thus the probe characteristics, when applied to microcircuits are not controlled by this step.

The external surfaces, adjacent the mandrel and the base, are then removed, for example, by shearing the coated outside edges of the mandrel and the base, and peeling the copper deposit off of the surfaces. This peeling step is improved by the passivation of the initial electroless copper plate, and as a result the surfaces peel off, leaving the copper which has been plated in the holes. The thus exposed electroless copper plate package including the holes filled with copper is then polished and cleaned by conventional methods, such as sanding and the use of degreasers, and prepared for the application of a photoresist to both sides of the package in order to cover each plugged hole, on both sides, and to produce the desired circuits outlined on the base side. A redundant circuit may be provided on the mandrel side, or a circuit may simply be masked sufficiently to cover the plugged holes in order to prevent removal of the copper in the hole during the etching step which follows immediately. The etching can be done by normal known materials, such as ferric chloride, and removes all exposed copper. The mask covers the copper on the base side, in the form of the circuit desired, and the thin copper cladding produced by the electroless deposition is converted to the appropriate circuit. It should be noted this very thin layer forms the fine defined circuit product in accordance with this invention.

After etching, drying, and removal of the mask, by standard means, the aluminum mandrel side of the circuit board is sanded or otherwise abraded to remove the thin protective epoxy coating and expose the aluminum sheet which is then removed independent of the copper probes to expose the probes. The aluminum is usually removable, for example, by the application of a sodium hydroxide solution which will react with the aluminum and dissolve it. Thus, it can be seen that, once this step is effected, a series of exposed probes, all of equal length, firmly embedded in and traversing through the epoxy board, is produced. Thus, the length and diameter of the probes can be clearly controlled by selection of the appropriate thickness for the aluminum mandrel, and the appropriate size for the drilled holes.

In order to further secure the probes to the epoxy base, in accordance with an aspect of the invention, the drilling or other hole formation can be effected, for example, in a manner that forms a step in the hole wall or produces a varying diameter hole. One way in which this may be done is the drilling of a smaller hole partially through the epoxy board from the eventual circuit side, and the drilling of a slightly larger hole, of the same inside diameter as the outside diameter of the desired plug, from the aluminum side. The resulting shoulder or step would even further improve the adherence, by preventing the probe from being pulled or pushed through the final structure in the direction of the circuit.

In the final step, the circuit is then dipped in a solder solution, for example a 60/40 tin/lead mixture, and excess solder blown off with hot oil to form solder surfaces on the exposed copper. The unit is then heated for solder reflow to obtain a smooth even coating of solder, and the coating of solder on the outside of the plug structure further enhances adherence to the base.

DESCRIPTION OF THE DRAWINGS

A better understanding of the present invention may be had from a consideration of the following detailed description, taken in conjunction with the accompanying drawings in which.

DESCRIPTION OF THE PREFERRED EMBODIMENTS

Figure 1:
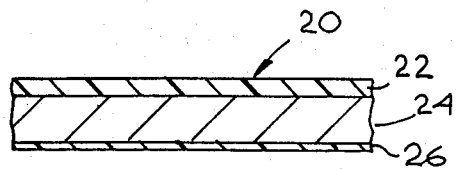
FIGS. 1–11 illustrate the steps performed in producing the probe structure of the present invention.

As shown in FIG. 1, a board 20 is formed of a laminate package consisting of a normal dielectric board, or other board amenable to electroless plating. Exemplary board materials include phenolic resins, acrylic resins, the polyimides, and epoxy resin boards. The board is selected in accordance with the particular use of the probe being produced. In the present process, generally, epoxy dielectric boards are utilized, and they are bonded by suitable adhesive, such as an epoxy or other means, to aluminum layer 24. The aluminum layer will eventually be removed to form the probes of the present invention, and thus it is not necessary to utilize aluminum, and other disposable mandrels may be utilized. The basic limitation of the selection of the mandrel is that it must be dissolvable or separable from both the circuit board and the eventual probe, which is usually copper. Aluminum was selected for use as the exemplary material, in view of its solubility in concentrated sodium hydroxide solutions, and the fact that highly alkaline solutions do not adversely affect the copper probes or the epoxy bases. In addition, for proper electroless deposition, the laminate package is provided with a second dielectric layer 26 which is bonded to the aluminum layer. It should be noted that this layer should not be nearly as thick as the circuit board layer, as it is eventually to be removed.

Additionally, the thickness of the aluminum or other removable mandrel determines the maximum extent of protrusion of the probes from board 22 in the final product, and thus the thickness of the aluminum mandrel is to be selected, depending upon the particular design and testing to be done with the probes. In this light, then, the circuit board itself is selected for the particular purpose and thickness, depending upon structural integrity requirements, and the particular means utilized for attaching the eventual board to the probe positioning structure required to test microcircuits.

Figure 2:
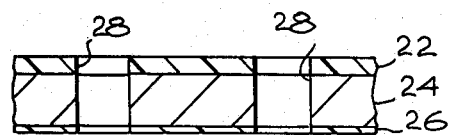

In FIG. 2, the sectional schematic shows the base board 22, the aluminum mandrel 24 and the epoxy backing 26 after holes of the desired size have been drilled in the appropriate places. The diameter and location of the hole determines the outside diameter and positioning of the probe produced in accordance with the present invention, and, thus, the positioning and drilling of the holes is of great importance. Further, the particular hole size available is not controlled by the desired characteristics of the thin microcircuits produced on the surface of the board as, in accordance with the present invention, the circuitry on the side opposite the probes is produced independent of the production of the probe itself. Thus, it is possible to produce probes of sizes down to 0.008 inches in diameter. Generally, however, the probes would be slightly larger than this, and would most commonly be 0.013 to 0.016 inches in diameter. The probes could be larger, if desired, based on the particular use of the probe.

The surfaces of the holes shown as 28 in FIG. 2, and the surfaces of the two dielectric epoxy boards 22 and 26 are then coated with, for example, copper or other conductive metal through electroless deposition or vacuum deposition. The result is a board surface layer 30 of copper, a back surface layer 32 of copper, and a very thin coating 34 on the inner surfaces of the hole walls. The electroless deposition is effected by standard processes of electrodeposition of copper using, for instance, palladium chloride and stannous chloride catalysts. Additionally, other conductive coatings such as nickel may be utilized. The thickness of the coating, thus provided, is from about 0.00001 to about 0.0001 inches. However, this thickness is not a controlling factor. Thickness is to be selected to provide continuity for the subsequent electroplating step in the process herein, and thus the minimum thickness would be defined by this need for continuity. In addition, the maximum thickness should be selected such that the maximum plating thickness would be the thickness of the desired eventual circuit leads. However, it is not necessary to plate to this thickness since it is possible to electroplate the structure of the present invention, at a subsequent time, to a desired independent thickness for circuitry. Thus the electroless deposition thickness is not criticial but should not be greater than the thickness of the desired leads.

Figure 3:
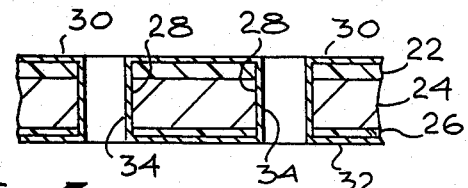

The clad structure as shown in FIG. 3 is then passivated in order to provide for easy removal of the eventual electroplate coat. The copper cladding may be passivated by, for example, submersion in a chromic acid solution to produce a passive layer, or by other well known methods. In addition, the passivation may be effected by a flash plating of nickel, the selected passivation technique being that appropriate for the easy removal of the surface layer of the eventual electroplated copper or other metal.

Figure 4:
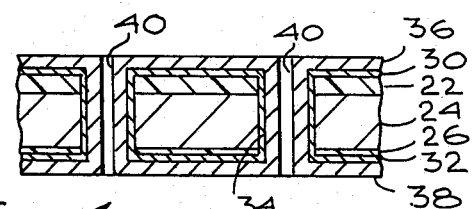

FIG. 4 shows the structure after the electroplating step has been completed. As can be seen in the drawing, the copper or other selected metal forms a surface layer 36 on one side, and 38 on the other side, and substantially fills the holes as shown by surfaces 40. Commonly, the plating, as is conventional in the industry, is copper, and is performed by the preparation of a plating solution which contains 24 ounces of copper sulfate per gallon and 7 ounces per gallon of sulfuric acid. The copper is plated onto the assembly at from 60° to 120° F. and from 20 to 50 amps per square foot. However, depending upon the particular circumstances, these general parameters may be changed. Generally, this plating would be about 0.010 inches, but could be thinner or thicker. As noted above this particular plating is not used for the circuit on the surface, and thus the limitations on plating would be determined by the desired wall thickness for the probes produced in accordance with this process. When holes of about 0.016 inches in diameter are utilized, and surface plating to 0.010 inches is utilized, the plating on the wall surfaces 40 is usualy 0.007 inches. That is, the structure produces a cylinder having a central hollow core of about 0.002 inches in diameter. This limitation is a result of a concentration gradient in the copper sulfate solution, and the very low availability of the copper sulfate for plating when the hole becomes very small. Thus, plating can be continued until the appropriate streng this obtained in the walls of the eventual probes, as the thickness of the plating on the surfaces 36 and 38 does not contribute to or control the eventual circuit characteristics.

Figure 5:
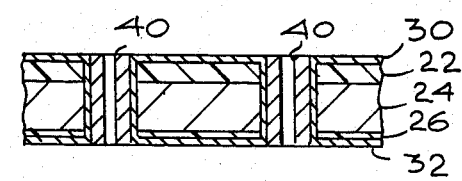

After removal from the plating bath, the structure shown in FIG. 4 is dried and then surface layers 36 and 38 are removed, for example, by peeling. The resulting structure is shown in FIG. 5. It should be noted that the peeling can be effected, for instance, by shearing off excess edge material of the laminate, not shown, and then mechanically peeling or removing the copper layers. The result of this procedure is the severance of the peeled plate from the core plugs that form the probes. Surfaces 36 and 38 could be cut off as well, in order to further decrease the possibilities of removal of one of the probes. The leftover copper, which has been peeled off, can be redissolved into a copper sulfate solution, and reused. Thus there is no waste bythis step.

Figure 6:
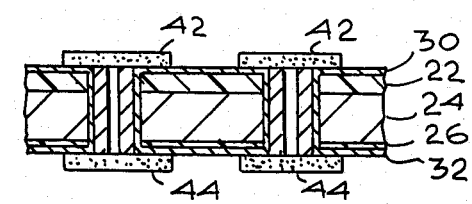

The resulting structure is then cleaned, for example by sanding, and degreased with standard acid or alkaline degreasers, such as are commercially available. The cleaning and degreasing steps are performed in order to prepare surfaces 30 and 32, and probe surface 40 for the application of a negative photoresist mask. Again, the masking procedures and techniques are generally known in the art, but by way of example, a pattern may be utilized to develop a photoresist, after it has been laminated on the surface of the laminate and dried. The thus developed photoresist is washed to remove the extraneous material, the pattern remaining covering and protecting the surfaces desired. The completed mask is shown in FIG. 6 where masks 42 and 44 are images of each other, and protect plugs 40 on the base structure of the laminate. It is to be understood that the masks would extend elsewhere on the surface, in order to protect copper cladding 30 from removal, and eventually produce the leads for the connecting circuitry.

Figure 7:
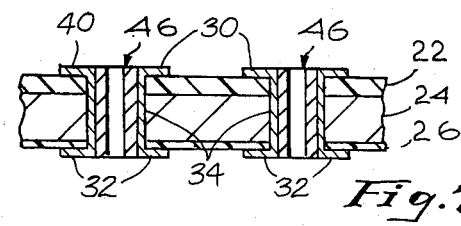
Figure 8:
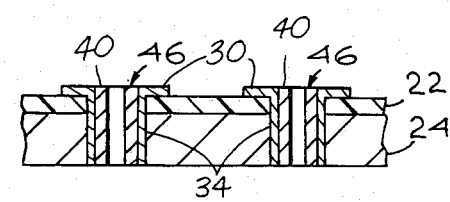

The surfaces of the unit are then etched by standard procedures, such as the use of ferric chloride, to dissolve and remove copper coatings 30 and 32 in the areas that are unmasked. The mask is then removed by standard techniques of dissolution, and the resulting structure is shown in FIG. 7. In this structure, circuit board 22 is still in contact with aluminum mandrel 24 which is covered by epoxy protector 26. Probes 46 are shown as single entities, although they are comprised of original plug core 40, shown in FIG. 4, and the portions of copper surface 30 which were protected in the masking step and originally produced by the electroless deposition. The back surface, that is the one most nearly adjacent epoxy protector 26, is now sanded or otherwise abraded to remove the slight projections of copper and the epoxy protector 26. The resulting structure having exposed mandrel 24, board 22 and probes 46 is shown in FIG. 8. It should be noted, at this point, that epoxy layer 26, used for protection, is not always necessary.

Figure 9:
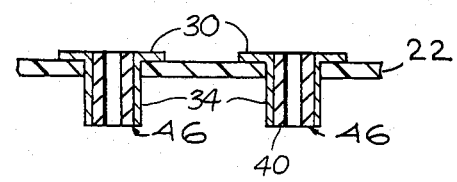
Figure 10:
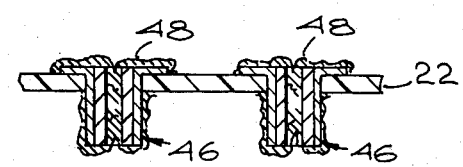
Figure 11:
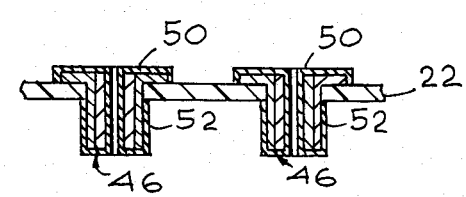

The resulting exposed aluminum mandrel and circuit board combination is then dipped in a sodium hydroxide, or other alkali metal hydroxide, solution to dissolve the aluminum. If other metals are utilized as a mandrel, different procedural steps may be necessary, the requirement being that the mandrel, preferably aluminum, be removable from the circuit board and the probes without damage to either of these components. The structure resulting from this removal is shown in FIG. 9, and is basically the probe structure needed for the product of the present invention. In this form probes 46 protrude from circuit board 22 a distance approximately equal to the thickness of the mandrel, and are located by the original hole drilling process. The hole sizes, from 13 to 16 mils, are limited by the present state of the art of machine drilling. The holes can be produced mechanically, by electrodischarge, or by lasers. The method of production of the holes is not critical, as long as their location and size are appropriately controlled. The board, shown in FIG. 9, is then dipped in a solder bath of, preferably, a 60/40 solution of tin and lead, and then subjected to a stream of hot oil to produce the general soldered appearance shown in FIG. 10. The solder 48 coats the conductive portions, and does not stick to board 22. As more particularly shown in FIG. 11, the board is then reheated to reflow the solder, and the resulting smooth solder surface 50 contributes to the stability of the probes of the present invention by covering outer surface 52 of probes 46 and coming into contact with board 22 at the juncture of the probe in the board, thus helping to prevent loosening of the probes.

The soldering of the 60/40 tin/lead mixture is preferably "hydro-squeegeed", which uses a hot oil spray to layer the solder to a thickness measured in millionths of inches, and thus the thickness is controlled by the temperature, the dip time, the air blow, etc. These procedures are generally standard in the art.

Figure 12:
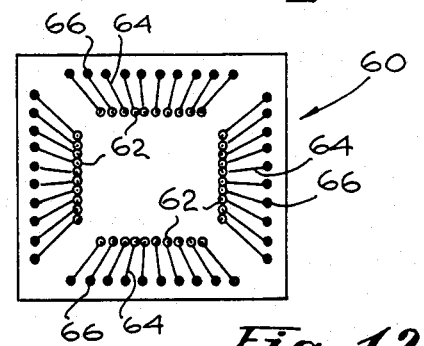
FIG. 12 illustrates a probe-containing circuit board prepared in accordance with the present invention.

In FIG. 12, a circuit board usable as a testing unit and prepared in accordance with the present invention is shown. The board 60 is shown after completion of the solder reflowing step, and has probes 62 protruding from it. In the structure shown, the array of probes is positioned to test a specific set of circuits. The positions of the probes, as previously discussed, are controlled by the conformation of circuits to be tested, and thus any desired design or pattern for the probes may be utilized. Board 60 is slightly transparent, and thus the circuitry 64 for connecting the probes to external electrical or electronic metering and/or testing equipment is visible. In the circuit shown, each probe is provided with circuitry 64 which terminates at solder connection 66 for attaching the probe unit to external circuitry for use, such as providing a mounting structure with electrical connections to position the probe during operation, and to connect to the probe for obtaining the appropriate test data.

Although there have been described above specific arrangements, and a method of manufacture, of a probe circuit structure in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined by the appended claims.

What is claimed is:

1. A probe device for testing microcircuits comprising:
   a base circuit board having first and second opposed faces;
   an array of conductive metal, hollow cylindrical, thick-walled probe elements protruding substantially beyond one face of said board and passing through holes therein to a circuit mounted along the other face of the board;
   each probe element comprising:
      a tube portion passing through a hole in the board and protruding from one side of the board, said tube portion being no larger in diameter than the diameter of the hole it passes through;
      an integrally formed lateral extension of the tube portion extending along said other face of the board radially outward from the tube portion; and
      a substantial layer of solder melted onto the protruding portion of each tube portion to increase the effective diameter of the tube portion protruding outside of the board and lock each probe element in the board; and
   wherein each tube portion comprises a first thin layer of conducting metal extending through the hole, contiguous with the surface of the board defining the hole, and along the entire extent of the tube portion protruding from the board; a second layer of conductive metal deposited on the inner surface of the first layer and coextensive therewith, said second layer being substantially thicker in radial dimension than said first layer; and a third layer of conducting metal coating the inner surface of the second layer.

2. The device of claim 1 wherein each probe element includes a central bore substantially filled by solder.

3. The device of claim 1 wherein said first and second layers are copper and said third layer is solder.

4. The device of claim 3 wherein said first layer is integral with said lateral extension, and wherein said second layer extends from said other face of the board by an amount equal to the thickness of said lateral extension.

5. The device of claim 4 wherein said third layer extends along the inner surface of the second layer and along all exposed surfaces of the probe element.

6. The device of claim 4 wherein said third layer extends contiguously to cover all inner and outer exposed surfaces of the tube portion and the lateral extension.

* * * * *